United States Patent
Bibby et al.

(10) Patent No.: US 10,095,118 B2
(45) Date of Patent: Oct. 9, 2018

(54) LITHOGRAPHY OPTICS ADJUSTMENT AND MONITORING

(71) Applicant: CYMER, LLC, San Diego, CA (US)

(72) Inventors: Thomas Frederick Allen Bibby, San Diego, CA (US); Khalid Khulusi Tahboub, Lafayette, IN (US); Donald James Haran, San Diego, CA (US); Rostislav Rokitski, San Diego, CA (US); Joshua Jon Thornes, San Diego, CA (US)

(73) Assignee: CYMER, LLC, San Diego, CA (US)

( * ) Notice: Subject to any disclaimer, the term of this patent is extended or adjusted under 35 U.S.C. 154(b) by 45 days.

(21) Appl. No.: 15/208,152

(22) Filed: Jul. 12, 2016

(65) Prior Publication Data

US 2018/0017875 A1    Jan. 18, 2018

(51) Int. Cl.
*G03F 7/20* (2006.01)
*H01S 3/00* (2006.01)
*H01S 3/22* (2006.01)

(52) U.S. Cl.
CPC ...... *G03F 7/70041* (2013.01); *G03F 7/70025* (2013.01); *G03F 7/70141* (2013.01); *H01S 3/0014* (2013.01); *H01S 3/22* (2013.01)

(58) Field of Classification Search
CPC ...... H01S 3/22; H01S 3/0014; G03F 7/70025; G03F 7/70041
See application file for complete search history.

(56) References Cited

U.S. PATENT DOCUMENTS

| | | | | |
|---|---|---|---|---|
| 5,179,419 A | * | 1/1993 | Palmquist | G01N 21/952 356/237.2 |
| 6,192,064 B1 | * | 2/2001 | Algots | G02B 5/1828 372/100 |
| 6,690,704 B2 | * | 2/2004 | Fallon | G03F 7/70025 372/55 |
| 6,700,916 B1 | * | 3/2004 | Kramer | G03F 7/70025 372/57 |
| 2009/0080476 A1 | * | 3/2009 | Partlo | G03F 7/70341 372/25 |

* cited by examiner

*Primary Examiner* — Steven H Whitesell Gordon
(74) *Attorney, Agent, or Firm* — Arent Fox LLP

(57) ABSTRACT

Methods and apparatus for in situ compensation for damage or misalignment of optical elements are disclosed. Also disclosed are methods and apparatus for facilitating alignment of replacement optical elements so that the amount of time in a system including the optical elements can be reduced. Also disclosed are methods and apparatus for processing an image of a beam generated by an optical system to extract information indicative of an extent of damage to optical elements in the optical system and/or misalignment of the optical elements. Information pertaining to an extent of damage to optical elements in the optical system can be used to optimally schedule maintenance events for the optical system.

19 Claims, 12 Drawing Sheets

LITHOGRAPHY OPTICS ADJUSTMENT AND MONITORING

FIELD

The present disclosed subject matter relates to optics in laser-generated light sources such as are used for integrated circuit photolithographic manufacturing processes.

BACKGROUND

The optical elements used in light sources for semiconductor photolithography deteriorate over time, which in turn leads to a decline in light source performance that cannot be remedied while the system is in production use. For example, calcium fluoride ($CaF_2$) is a crystalline material commonly used in deep ultra-violet (DUV) light sources for various applications such as, e.g., windows, beamsplitters, and reflectors. While $CaF_2$ is a robust material for extended use in lithography systems, degradation of $CaF_2$ may occur via any one of several mechanisms. Aside from catastrophic fracture, these mechanisms tend to degrade performance of the $CaF_2$ optic slowly. Initially, such degradation may be relatively inconsequential, but eventually the optical performance of the affected component deteriorates sufficiently that the light source must be taken off line to replace the optic or the module containing the optic.

One particular optical degradation mechanism involves the formation of slip planes. Slip planes occur when thermo-mechanical stresses induce subtle fractures in the $CaF_2$ crystal lattice. Visually, slip planes appear as lines on the optic that are disposed at well-defined angles relative to the orientation of the crystal lattice. Visual inspection is practical only after the damaged optic has been removed from the light source, which can occur only when the light source has been removed from production.

Another optical degradation mechanism is the formation of line damage, one form of which results from the superposition of multiple portions of a beam on an optic that has a coating. The combined energy of these multiple portions may exceed a damage threshold for the coating on the optic. When this occurs it damages the coating in the area of superposition, which creates a distinct line that can diffract light. The line damage is a problem because it can cause distortions in the beam profile that reduce module lifetime. It would be advantageous to be able to detect the existence and extent of line damage.

Yet another aspect optical degradation mechanism is the presence of point-like defects due to particles on an optic at some location within the system. Such particles typically do not have an undue adverse effect on optical performance because they are so few in number, but they can affect image processing. It would be advantageous to be able to identify the presence, location, and nominal size of point-like defects.

An additional damage mechanism that degrades optical performance is the onset and growth of dendritic formations. These dendrites resemble a white fuzz, and they are commonly referred to as such. The presence of dendrites indicates a coating failure, which leads to localized heating of the optic in the vicinity of the dendrites. The heating exacerbates coating failure, so the affected region of the optic expands, which further exacerbates the localized heating and causes thermal lensing. The optical performance of the laser then degrades, and eventually the affected optics must be replaced. It would be advantageous to be able to detect the onset and progression of dendrite formation.

A common aspect of the challenges associated with these damage mechanisms is a need for a way to detect and identify low-level signals associated with these defects, and for attributing these signals to specific defect types. A further need exists for ways of monitoring the evolution of these defects that allows prediction of how much time remains before light source optical performance decreases sufficiently that an optic or module must be replaced.

Eventually, the light source must be taken out of production use so degraded modules and optics can be replaced. This obviously leads to downtime for the scanner. It is desirable that downtime be minimized to the fullest extent possible. While planning maintenance events can reduce the adverse impact of lost production time, all downtime comes at a significant cost to chip makers. The total amount of time the light source is out of production is sometimes referred to as the "green-to-green" time.

During maintenance, once any required replacement modules and optics have been installed, the light source must be re-aligned. As mentioned, the light sources can be embodied as a set of modules. In such cases, alignment typically involves adjusting positioners that tip and/or tilt individual optical elements within the modules in some cases, and entire modules in other cases. Once aligned, the light source can be used for significant amount of time without additional adjustment. The amount of time required to realign the optics and modules adds disadvantageously to the green-to-green time. Alignment may be carried out by the use of mechanical alignment actuators but this can be unduly time consuming.

One part of the alignment process may be carried out to compensate for chamber resonances. Laser radiation for semiconductor photolithography is typically supplied as a series of pulses at a specified repetition rate. Chamber resonances may occur at some repetition rates and cause sharp increases in performance metrics, (e.g. pointing and divergence) near the resonant frequencies, with low valleys or floors at frequencies adjacent to the resonance. The presence of resonances per se may be acceptable provided all the data points remain within specification, although additional time and effort may be required during alignment to keep the performance metrics within specification. In addition, a resonance caused peak-to-valley differences in performance metrics may create technical challenges for scanner design and control.

Measures to minimize the total amount of green-to-green time include both reducing the number of maintenance events and reducing the length of the maintenance events when they do occur. The number of maintenance events can be reduced by extending the operational life of the modules and optics and by having a reliable way of determining the amount of optic damage in situ. The length of the maintenance events can be reduced by reducing the amount of time needed to align replacement modules and optics.

SUMMARY

The following presents a simplified summary of one or more embodiments in order to provide a basic understanding of the embodiments. This summary is not an extensive overview of all contemplated embodiments, and is not intended to identify key or critical elements of all embodiments nor delineate the scope of any or all embodiments. Its sole purpose is to present some concepts of one or more embodiments in a simplified form as a prelude to the more detailed description that is presented later.

According to one aspect, the subject matter of the present disclosure addresses the problem that current downtimes are too long by providing a way to reduce downtime. The subject matter of the present disclosure also addresses the problem of extending the life of modules and optics. The subject matter of the present disclosure also addresses improving scanner performance at repetition rates at or near a chamber resonance.

The subject matter of the present disclosure addresses these problems at least in part by using electrically operated and controlled alignment actuators to adjust the optical elements and modules instead of purely mechanical alignment actuators. The subject matter of the present disclosure also addresses these problems at least in part through provision of optical sensors, e.g., cameras, for imaging fluorescent alignment screens that indicate a state of alignment. The subject matter of the present disclosure addresses these problems at least in part by using data from a combined autoshutter metrology module ("CASMM") to guide alignment. This alignment could be carried out in any one of several operational modes. For example, as described in more detail below, alignment could be carried out in a manual mode, a semi-automatic mode, a full automatic mode, a light source directed mode, or a scanner directed mode.

According to another aspect, the provision of electrically adjustable actuators with an on-board controller creates the ability to perform light source alignment dynamically, with adjustments and validation taking place during pauses in production use. It also creates the ability to perform ongoing performance metric flattening (i.e., reducing differences between maximum and minimum values). For example, when the scanner directs operation at a particular repetition rate change that falls near a chamber resonance frequency, the light source may adjust one or more optics to compensate for the resonance by reducing the resonance peak.

According to another aspect, the subject matter of the present disclosure addresses the problem of detecting the presence of one or more slip planes from near field images, where the detection may be automatic, and where the temporal evolution of the slip planes may be sensed and quantified.

According to another aspect, the subject matter of the present disclosure addresses determining whether the laser beam is clipping an aperture within the light source by detecting diffraction caused when the at least partially coherent laser beam diffracts upon striking an obstruction such as the edge of an aperture.

According to another aspect, the subject matter of the present disclosure addresses sensing the presence of vertical line damage.

More generally, according to another aspect, the subject matter of the present disclosure addresses detecting the presence of lines embedded in a noisy background signal.

According to another aspect, the subject matter of the present disclosure addresses sensing the presence of point-like defects such as particles on an optic.

According to another aspect, the subject matter of the present disclosure addresses detecting some types of optical misalignment from the presence of fringes parallel to and immediately adjacent to the edge of a near field image.

According to one aspect there is disclosed a photolithographic apparatus comprising a light source having at least one optical element located within a housing and an actuator that extends through a wall of the housing, is mechanically coupled to the at least one optical element, and is adapted to incrementally adjust the at least one optical element in response to a signal. A component of the actuator for imparting motion to the actuator in response to the signal is located outside of the housing. The photolithographic apparatus also comprises a control system for generating the signal. The control system may generate the signal at least partially in response to a command input by a user. The photolithographic may further comprise a module arranged to obtain an image of a light beam from the light source and a module arranged to extract information from the image, with the control system generating the signal at least partially in response to the information extracted from the image. The image may be a near field image of the light beam. The module may be additionally arranged to obtain a far field image of a light beam from the light source and further comprise a module arranged to extract information from the far field image, with the control system generating the signal at least partially in response to the information extracted at least one of the near field image and the far field image. The module arranged to obtain an image of the light beam may be a combined autoshutter metrology module. The module arranged to extract information from the image performs feature extraction may use at least one of a Circle Hough Transform, a Standard Hough Transform, and a Radon Transform. The module arranged to extract information from the image may performs extraction of information indicative of a state of alignment of the optical element or may be used to detect defects in the optical element. The actuator mechanically coupled to the optical element moves the optical element in response to the control signal, that is, may adjust one or more of the position or orientation (e.g., tip or tilt) of the optical element.

According to another aspect, there is disclosed a photolithographic apparatus comprising a light source having at least one optical element, a module arranged to obtain a near field image and a far field image of a light beam from the light source (which may be a combined autoshutter metrology module), a module arranged to extract near field information indicative of a state of alignment of the optical element from the near field image, a module arranged to extract far field information indicative of a state of alignment of the optical element from the far field image, a control system for generating a control signal based at least in part on the at least one of the near field information and the far field information, and an actuator mechanically coupled to the at least one optical element and responsively connected to the control system and adapted to incrementally adjust an alignment of the at least one optical element in response to the control signal.

According to another aspect, there is disclosed an optical element module for use in a photolithographic apparatus, the optical element module comprising a housing, an optical element positioned within the housing, and an actuator that extends through a wall of the housing, is mechanically coupled to the optical element, and is adapted to incrementally adjust the at least one optical element in response to a signal. A component of the actuator for imparting motion to the actuator in response to the signal is located outside of the housing. The actuator may comprise a threaded shaft coupled to the optical element and a motor coupled to the threaded shaft and arranged to rotate the threaded shaft. The motor may comprise a stepper motor. The optical element may located within a housing having at least one wall, and the the actuator may be a through-the-wall actuator that extends through the at least one wall and be coupled to the optical element within the housing, with the element for imparting motion to the actuator in response to the control signal being located outside of the housing.

According to another aspect, there is disclosed a method for adjusting an optical element in a light source in a photolithography system comprising the steps of generating a light beam using the light source, obtaining an image representative of the light beam, extracting information from the image, generating a control signal in response to the information from the image, and applying the control signal to an actuator mechanically coupled to an optical element in the light source to incrementally adjust the optical element in response to the control signal. The image may be a near field image of the light beam in which case the extracted information is near field information. The method may additionally comprise the steps of obtaining a far field image representative of the light beam and extracting far field information from the far field image, in which case the step of generating a control signal may comprise generating the control signal in response to at least one of near field information and the far field information. The extracted information may indicate a state of alignment of the optical element.

According to another aspect, there is disclosed a method for adjusting an optical element in a light source in a photolithography system comprising the steps of generating a command to run a pulsed light source at a commanded repetition rate, determining whether the commanded repetition rate is sufficiently near a chamber resonance frequency to affect at least one performance parameter of the pulsed light source, generating a control signal if it is determined that the commanded repetition rate is sufficiently near a chamber resonance frequency to affect at least one performance parameter of the pulsed light source, and applying the control signal to an actuator mechanically coupled to an optical element in the light source to incrementally adjust the optical element in response to the control signal. The control signal may be derived using a value in a lookup table.

According to another aspect, there is disclosed a method for automatically detecting and adjusting an alignment of a light source for semiconductor photolithography, the method comprising the steps of obtaining an image of a light beam produced by the light source, extracting a near field portion from the image, obtaining image data from the near field portion, performing a transform operation on the image data, storing the results of the transform operation in a database, incrementally adjusting at least one optical element in the light source based at least in part on the results of the transform operation.

According to another aspect, there is disclosed a method for automatically detecting a state of a light source for semiconductor photolithography, the method comprising the steps of obtaining an image of a light beam produced by the light source, extracting a near field portion from the image, obtaining image data from the near field portion, performing a transform operation on the image data, storing the results of the transform operation in a database, in which the above steps are performed repeatedly over a period of time to detect the state repeatedly and store a plurality of results of the transform operation in the database and the plurality of stored results of the transform operation are compared to determine an evolution of the state over time, where maintenance is performed on the light source after a period of time having a duration based at least in part on the evolution of the state over time. The transform operation may be at least one of a Circle Hough Transform, a Standard Hough Transform, and a Radon Transform. The state may be an extent of existence of slip plane defects in at least one optical element in the light source.

DETAILED DESCRIPTION

Figure 1:
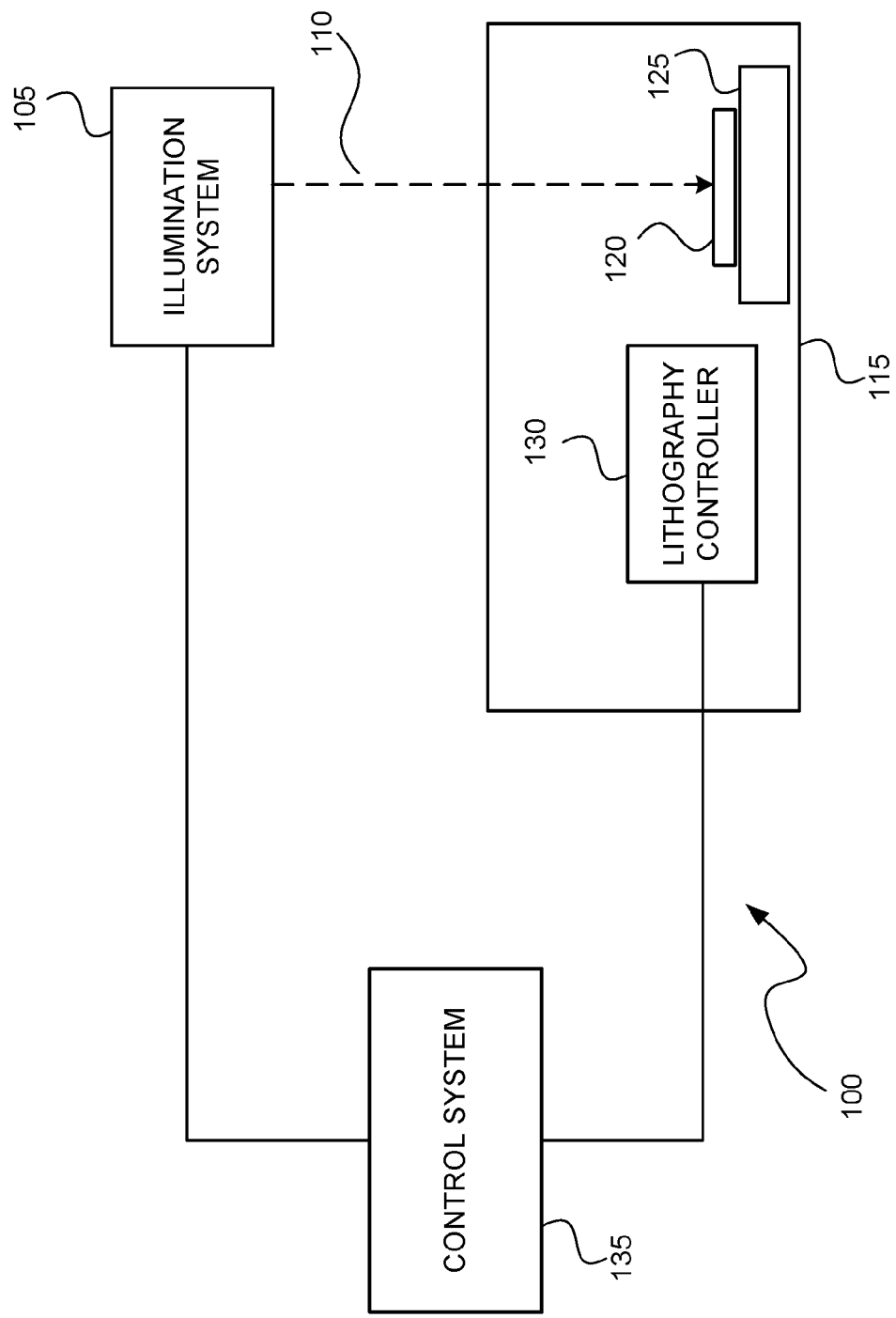
FIG. 1 shows a schematic, not to scale, view of an overall broad conception of a photolithography system according to an aspect of the disclosed subject matter.

Various embodiments are now described with reference to the drawings, wherein like reference numerals are used to refer to like elements throughout. In the following description, for purposes of explanation, numerous specific details are set forth in order to promote a thorough understanding of one or more embodiments. It may be evident in some or all instances, however, that any embodiment described below can be practiced without adopting the specific design details described below. In other instances, well-known structures and devices are shown in block diagram form in order to facilitate description of one or more embodiments. The following presents a simplified summary of one or more embodiments in order to provide a basic understanding of the embodiments. This summary is not an extensive overview of all contemplated embodiments, and is not intended to identify key or critical elements of all embodiments nor delineate the scope of any or all embodiments.

Referring to FIG. 1, a photolithography system 100 that includes an illumination system 105. As described more fully below, the illumination system 105 includes a light source that produces a pulsed light beam 110 and directs it to a photolithography exposure apparatus or scanner 115 that patterns microelectronic features on a wafer 120. The wafer 120 is placed on a wafer table 125 constructed to hold wafer 120 and connected to a positioner configured to accurately position the wafer 120 in accordance with certain parameters.

The photolithography system 100 uses a light beam 110 having a wavelength in the deep ultraviolet (DUV) range, for example, with wavelengths of 248 nanometers (nm) or 193 nm. The size of the microelectronic features patterned on the wafer 120 depends on the wavelength of the light beam 110, with a lower wavelength resulting in a smaller minimum feature size. When the wavelength of the light beam 110 is 248 nm or 193 nm, the minimum size of the microelectronic features can be, for example, 50 nm or less. The bandwidth of the light beam 110 can be the actual, instantaneous bandwidth of its optical spectrum (or emission spectrum), which contains information on how the optical energy or power of the light beam 110 is distributed over different wavelengths. The scanner 115 includes an optical arrangement having, for example, one or more condenser lenses, a mask, and an objective arrangement. The mask is movable along one or more directions, such as along an optical axis of the light beam 110 or in a plane that is perpendicular to the optical axis. The objective arrangement includes a projection lens and enables the image transfer to occur from the mask to the photoresist on the wafer 120. The illumination system 105 adjusts the range of angles for the light beam 110 impinging on the mask. The illumination system 105 also homogenizes (makes uniform) the intensity distribution of the light beam 110 across the mask.

The scanner 115 can include, among other features, a lithography controller 130, air conditioning devices, and power supplies for the various electrical components. The lithography controller 130 controls how layers are printed on the wafer 120. The lithography controller 130 includes a memory that stores information such as process recipes. A process program or recipe determines the length of the exposure on the wafer 120, the mask used, as well as other factors that affect the exposure. During lithography, a plurality of pulses of the light beam 110 illuminates the same area of the wafer 120 to constitute an illumination dose.

The photolithography system 100 also preferably includes a control system 135. In general, the control system 135 includes one or more of digital electronic circuitry, computer hardware, firmware, and software. The control system 135 also includes memory which can be read-only memory and/or random access memory. Storage devices suitable for tangibly embodying computer program instructions and data include all forms of non-volatile memory, including, by way of example, semiconductor memory devices, such as EPROM, EEPROM, and flash memory devices; magnetic disks such as internal hard disks and removable disks; magneto-optical disks; and CD-ROM disks.

The control system 135 can also include one or more input devices (such as a keyboard, touch screen, microphone, mouse, hand-held input device, etc.) and one or more output devices (such as a speaker or a monitor). The control system 135 also includes one or more programmable processors, and one or more computer program products tangibly embodied in a machine-readable storage device for execution by one or more programmable processors. The one or more programmable processors can each execute a program of instructions to perform desired functions by operating on input data and generating appropriate output. Generally, the processors receive instructions and data from the memory. Any of the foregoing may be supplemented by, or incorporated in, specially designed ASICs (application-specific integrated circuits). The control system 135 can be centralized or be partially or wholly distributed throughout the photolithography system 100.

Figure 2:
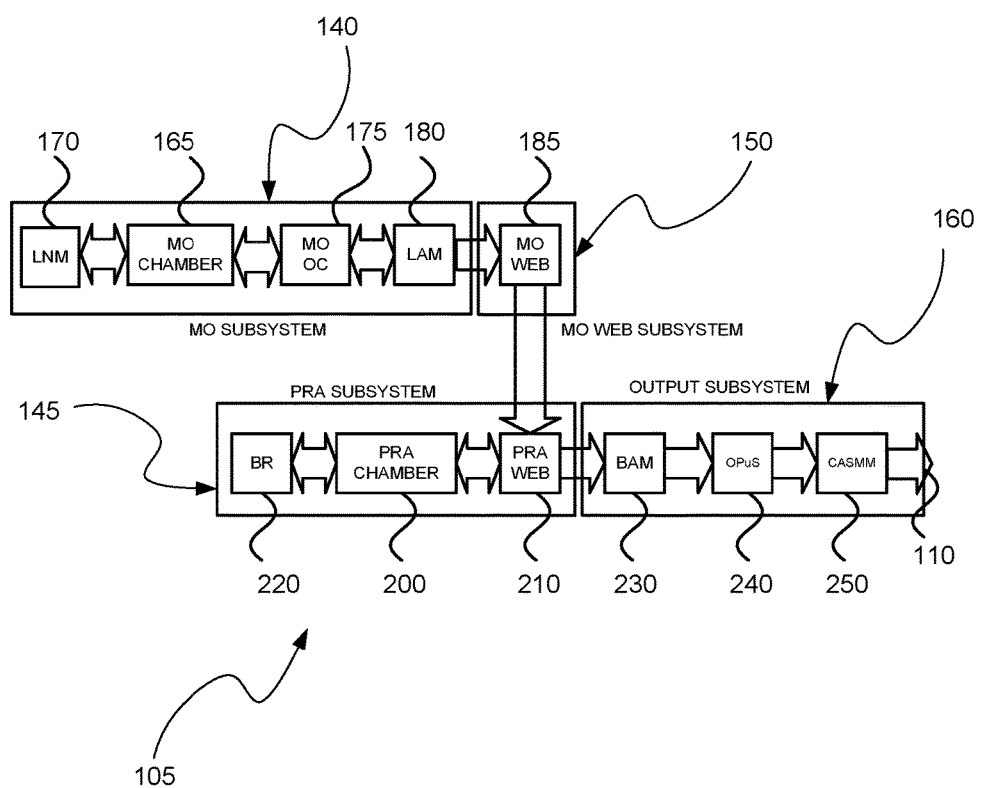
FIG. 2 shows a schematic, not to scale, view of an overall broad conception of an illumination system according to an aspect of the disclosed subject matter.

Referring to FIG. 2, an exemplary illumination system 105 is a pulsed laser source that produces a pulsed laser beam as the light beam 110. FIG. 2 shows illustratively and in block diagram a gas discharge laser system according to an embodiment of the disclosed subject matter. The gas discharge laser system may include, e.g., a solid state or gas discharge seed laser system 140, an amplification stage, e.g., a power ring amplifier ("PRA") stage 145, relay optics 150 and laser system output optics 160. The seed system 140 may include, e.g., a master oscillator ("MO") chamber 165, in which, e.g., electrical discharges between electrodes (not shown) may cause lasing gas discharges in a lasing gas to create an inverted population of high energy molecules, e.g., including Ar, Kr, Xe or $CO_2$ to produce relatively broad band radiation which may be line narrowed to a relatively very narrow bandwidth and center wavelength selected in a line narrowing module ("LNM") 170, as is known in the art.

The seed laser system 140 may also include a master oscillator output coupler ("MO OC") 175, which may comprise a partially reflective mirror, forming with a reflective grating (not shown) in the LNM 170, an oscillator cavity in which the seed laser 140 oscillates to form the seed laser output pulse, i.e., forming a master oscillator ("MO"). The system may also include a wavelength metrology module LAM 180. The LAM 180 may include an etalon spectrometer for fine wavelength measurement and a coarser resolution grating spectrometer. A MO wavefront engineering box ("WEB") 185 may serve to redirect the output of the MO seed laser system 140 toward the amplification stage 145, and may include, e.g., beam expansion with, e.g., a multi prism beam expander (not shown) and coherence busting, e.g., in the form of an optical delay path (not shown).

The amplification stage 145 may include, e.g., a lasing chamber 200, which may also be an oscillator, e.g., formed by seed beam injection and output coupling optics (not shown) which may be incorporated into a PRA WEB 210 and may be redirected back through the gain medium in the chamber 200 by a beam reverser 220. The PRA WEB 210 may incorporate a partially reflective input/output coupler (not shown) and a maximally reflective mirror for the nominal operating wavelength (e.g., at around 193 nm for an ArF system) and one or more prisms.

A bandwidth analysis module ("BAM") 230 at the output of the amplification stage 145 may receive the output laser light beam of pulses from the amplification stage and pick off a portion for metrology purposes, e.g., to measure the output bandwidth and pulse energy. The laser output light beam of pulses then passes through an optical pulse stretcher ("OPuS") 240 and an output combined autoshutter metrology module CASMM 250, which may also be the location of a pulse energy meter in lieu of the BAM 230. One purpose of the OPuS 240 may be, e.g., to convert a single output laser pulse into a pulse train. Secondary pulses created from the original single output pulse may be delayed with respect to each other. By distributing the original laser pulse energy into a train of secondary pulses, the effective pulse length of the laser can be expanded and at the same time the peak pulse intensity reduced. The OPuS 240 can thus receive the laser beam from the PRA WEB 210 via the BAM 230 and direct the output of the OPuS 240 to the CASMM 250.

Figure 3:
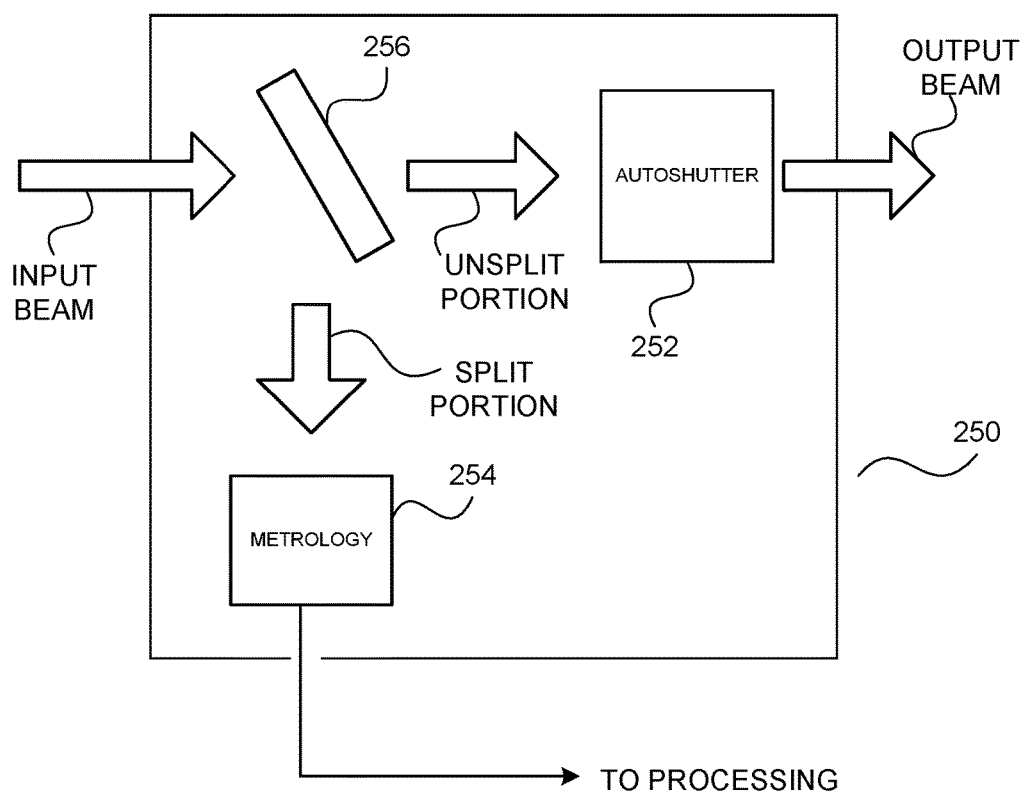
FIG. 3 shows a schematic, not to scale, view of an overall broad conception of a combined autoshutter metrology module ("CASMM").

FIG. 3 is a highly simplified and generalized block diagram of a possible arrangement for the CASMM 250. As shown, the CASMM 250 includes an autoshutter 252 and additional metrology 254 used to monitor laser performance in situ. The CASMM 250 receives an input beam which is split by a beamsplitter 256. The autoshutter 252 is arranged and configured to block the unsplit portion of the laser beam when closed and to allow the laser beam to exit without interference when opened. The autoshutter 252 may include an uncoated $CaF_2$ turning prism using total internal reflection to direct the blocked beam to a water cooled beam dump (not shown).

The metrology 254 preferably includes various photodetectors and position detectors, and also preferably includes an image sensor, e.g., 2D camera, which captures near field and far field 2D images of the beam. Thus, one output of the CASMM 250 is a two-dimensional (2D) cross section of the intensity of the beam profile. This 2D cross section may be used to measure the beam profile and detect distortions or irregularities. The control system 135 collects the data from the 2D camera in the metrology 254. The control system 135 processes the data to derive useful information on beam polarization, profile, divergence, and pointing for immediate observation or longer term storage and retrieval Immediate observation of the data may be part of field service events on lasers (alignment, troubleshooting). Storage and retrieval may be part of event investigations or trending laser performance over time for preventative maintenance purposes.

The near and far field 2D images are captured in a plane normal to the direction of beam propagation. A screen of fluorescent glass of the appropriate irradiation depth and decay time for 193 nm down-conversion to a visible wavelength for camera acquisition is used to create a visible image of the beam. Near and far field 2D imaging is preferably simultaneous and continuous during laser operation. The near field image may be an image of a plane containing a system hard aperture within the OPuS 240.

The near field gives unique information about the irradiance profile, which is a significant characteristic of the beam. The distribution across the cross-section is very important for the lithography industry. Slip planes developing in the bulk of the beam splitters, dendrite growth (degradation of the quality of the beamsplitter coating), misalignment, vertical line damage, clamp-induced stress and dust particle contamination have all unique signatures that may be visible in the near field image, or extracted by analysis of the near field image.

Many of the modules described above include provision for aligning the module and/or the optics within it. As used here and elsewhere in the specification, including the claims, "optical element" means a module or an optic in the module. Similarly, to incrementally adjust an optical element means to change the position and/or orientation of the optical element in one or more negative or positive increments that are small compared to an overall range of adjustment of the position or orientation of the optical element. As examples of incrementally adjustable optical elements, the LNM 170 may include provision for adjusting the position of its vertical tip. The tip and/or tilt of the MO OC 175 is preferably adjustable. The MO WEB 185 may include a folding mirror having an adjustable tip or tilt. The BR 220 may include a prism that has an adjustable horizontal translation and tilt. The PRA WEB 210 may have an optical output coupler that is adjustable and/or a folding mirror having an adjustable tip or tilt.

Typically adjustments on these components are carried out using a respective through-the-wall adjustor ("TWA"). These require a hand-manipulated hex driver to tip or tilt or translate an optic or module. TWAs may provide a sealed mechanical feed through to certain adjustments, e.g., accessed through the covers via a sealed mechanical feedthrough.

According to one aspect of the presently disclosed subject matter, adjustment is carried out with an electrically actuated TWA instead of a manually actuated TWA. A motor is mechanically coupled to the TWA. For example, the motor may have a shaft to which a hex adaptor is attached so that when the motor turns the shaft, the hex driver also turns, causing the end of the TWA to translate along its axis according to the direction of rotation of the shaft. Preferably, the motor is a stepper motor that can be turned in either direction in a number of discrete steps. The TWA preferably has a very fine (e.g., ¼-80) thread pitch so that the stepper motor requires a relatively large number of steps to move the TWA a small distance.

Figure 4:
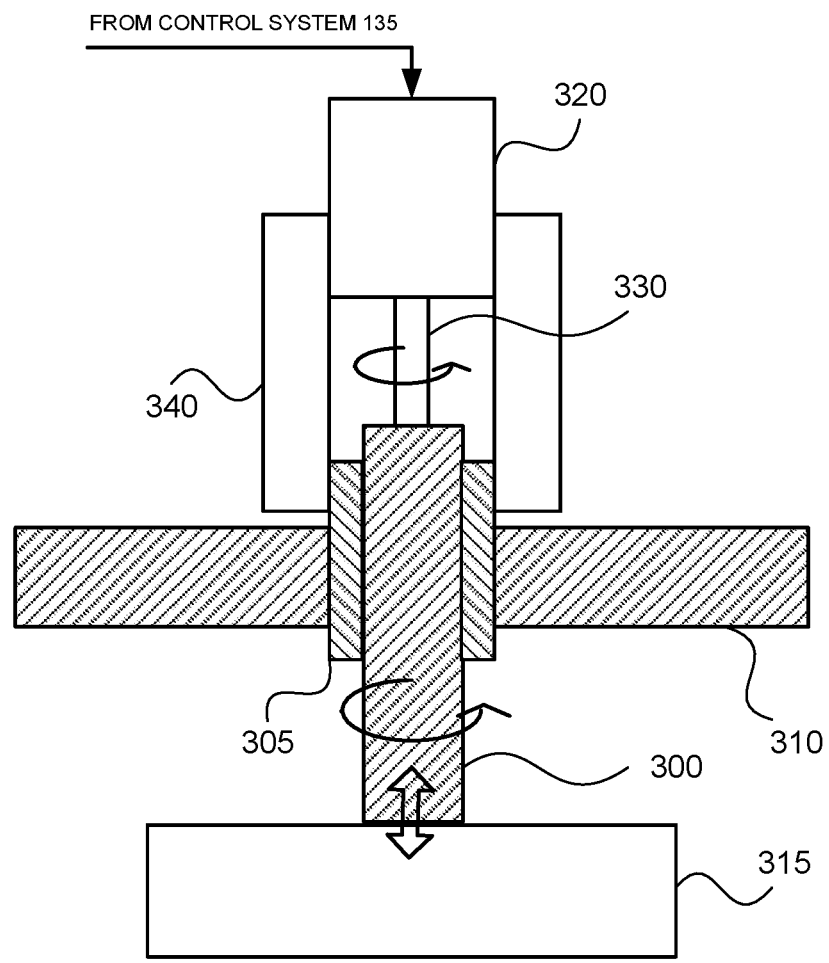
FIG. 4 shows a schematic, not to scale, view of a partially cut away view of an overall broad conception of an electrically actuated through-the-wall adjuster according to an aspect of the disclosed subject matter.

Such an arrangement is shown in FIG. 4. In FIG. 4, TWA 300 protrudes through a bushing 305 in a module wall 310 and is mechanically coupled to an optical feature 315 to control some aspect (e.g., position, tilt, tip) of the optical feature 315. The optical feature may be an optical element or all or part of an optical element as described above. The TWA 300 is rotated about its axis by a motor 320 to induce a lengthening or shortening of the TWA 300. The motor 320 is mechanically coupled to the TWA 300 by a shaft 330. In the case where the TWA 300 is of an existing design with a female hex socket, the shaft 330 may be provided with a male hex driver tip. The motor 320 is secured to the module wall 310 by a clamping arrangement 340 which, as shown, may clamp onto the bushing 305 to restrict relative movement of the motor 320 and the TWA 305. The motor 320 receives control signals from the control system 135 as shown and is connected to a power source (not shown).

Figure 5:
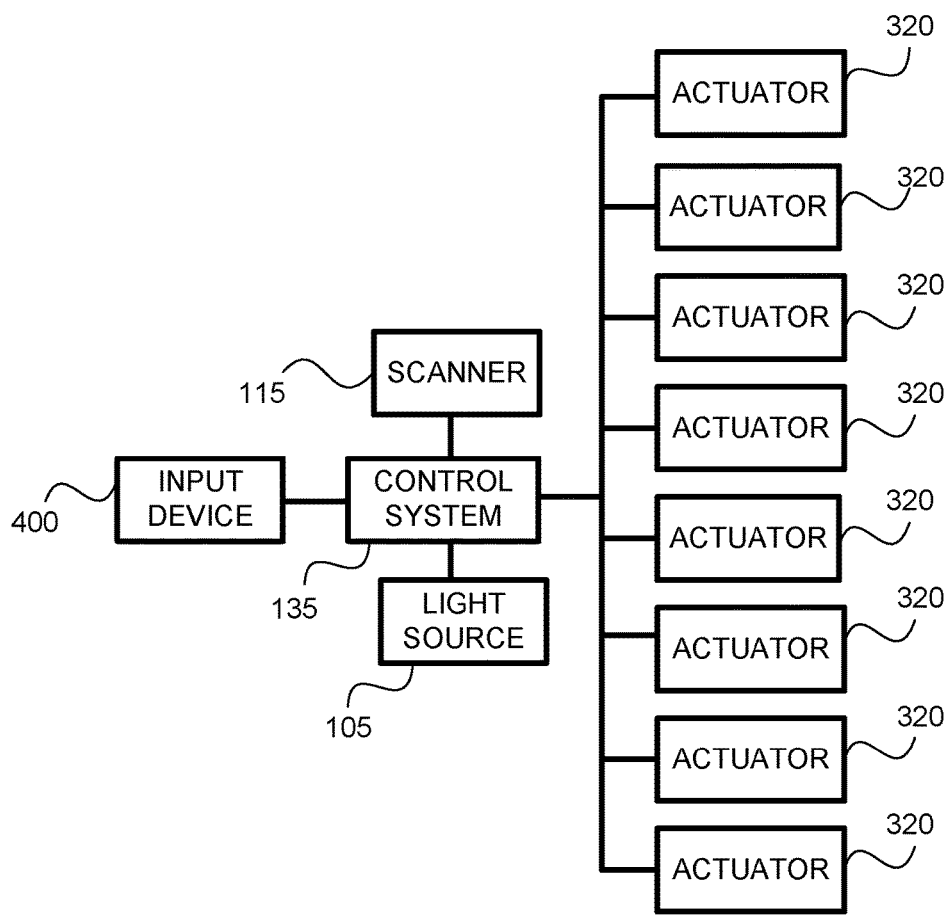
FIG. 5 shows a schematic, not to scale, partially cut away view of an overall broad conception of a system for controlling a group of actuators for electrically actuated through-the-wall adjusters according to an aspect of the disclosed subject matter.

As shown in FIG. 5, the overall system can include a number of actuators 320. As described above, the actuator 320 may be a stepper motor, but other devices could be used, for example, motors that are not stepper motors, or valves, pressure-controlled devices, piezoelectric devices, linear motors, hydraulic actuators, voice coils, etc. As shown, the actuators 320 are arranged to be under the control of the control system 135. During alignment, for example, the control system 135 applies signals directly or indirectly to the actuators 320 to cause the actuators to put their respective optical feature 315 in a properly aligned position and/or orientation. In some steps of the alignment procedure, the control system 135 causes an actuator to insert an optical element with a fluorescent screen into the beam line and within the field of view of a small camera, so that alignment up to that element can be performed and verified. This alignment could be carried out in any one of several operational modes. For example, as described in more detail below, alignment could be carried out in a manual mode, a semi-automatic mode, a full automatic mode, a light source directed mode, or a scanner directed mode.

For example, in a manual mode, a user could adjust individual actuators 320 via an input device 400 with a computer-based interface such as a graphical user interface ("GUI"). In some implementations, the GUI may be configured to display information about a beam profile as detected at one or more locations along an optical path in a laser source. For example, the beam profile information profile may include a 2-dimensional intensity map, other intensity information, beam width information, or other profile information. The beam profile information may be obtained by illuminating a phosphorescent surface with a beam or a portion of a beam, and/or by receiving information from a metrology module (such as CASMM 250, for example). This information may be usable, for example, for obtaining diagnostic information and/or for making manual adjustments to optical elements in the laser source. As another example, in a semi-automatic mode combinations of actions could be initiated with a single user input from the input device 400. Such actions could, for example, include an automatic sweep of selected actuators to complete one of the tasks in an alignment sequence. As another example, in an automatic mode an automatic completion of a sequence of tasks in an alignment protocol could be completed. In various implementations of a semi-automatic mode or an automatic mode, one or more actions may be based at least in part on beam profile information. In various implementations of a semi-automatic mode or an automatic mode, beam profile information may be gathered and adjustments may be made based on a request signal received from a scanner that receives light from the light source.

As another example, in a light source directed mode one or more optics could be adjusted based on image data from the CASMM 250 in light source 105. For example, adjustment could be based on correcting for diffraction fringes using the CASMM 250 to monitor the beam. If the beam is diffracting off an aperture, for example, then the fringes can be detected in a near field image from the CASMM 250. These fringes can be suppressed, for example, by adjusting one or more mirrors using an electrically actuated TWA 320.

Figure 6:
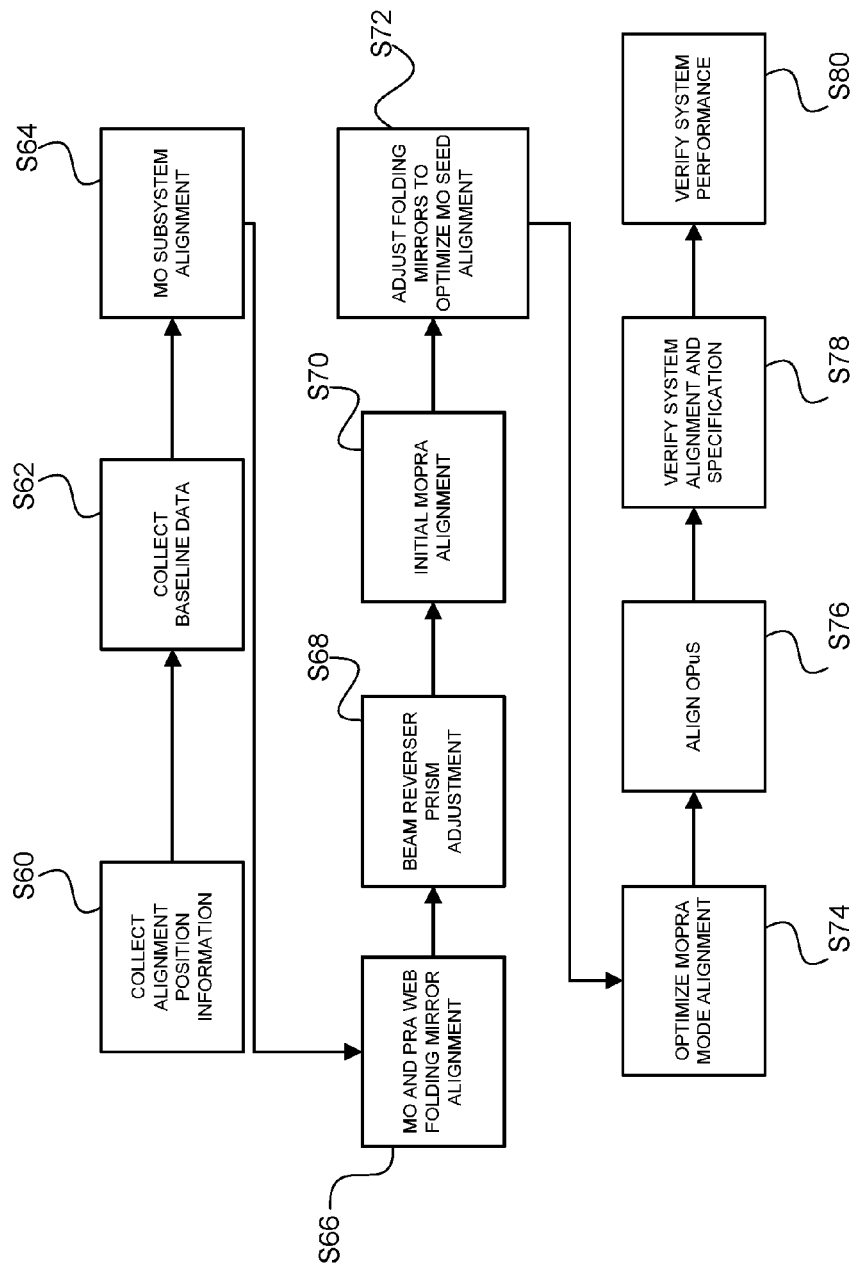
FIG. 6 is a flow chart depicting a method of aligning components in an illumination system according to an aspect of the disclosed subject matter.

A possible alignment procedure is shown in FIG. 6. In a step S60 initial alignment position information is collected. In a step S62 baseline data is collected. Then, various subsystems and optics may be aligned. For example in a step S64 the MO subsystem 140 may be aligned. Then the folding mirrors in the MO WEB 185 and PRA WEB 210 may be aligned in a step S66. Then a prism in the beam reverser 220 may be adjusted in a step S68. Then initial adjustment of the MOPRA can be performed in a step S70. In a step S72, adjustments can be carried out using a fold mirror to optimize MO seed alignment. Then MOPA mode alignment can be optimized in a step S74. Then the OPuS 240 may be aligned in a step S76. The final alignment and specification may then be verified in a step S78. Then overall system performance may be confirmed in a step S80.

Figure 7:
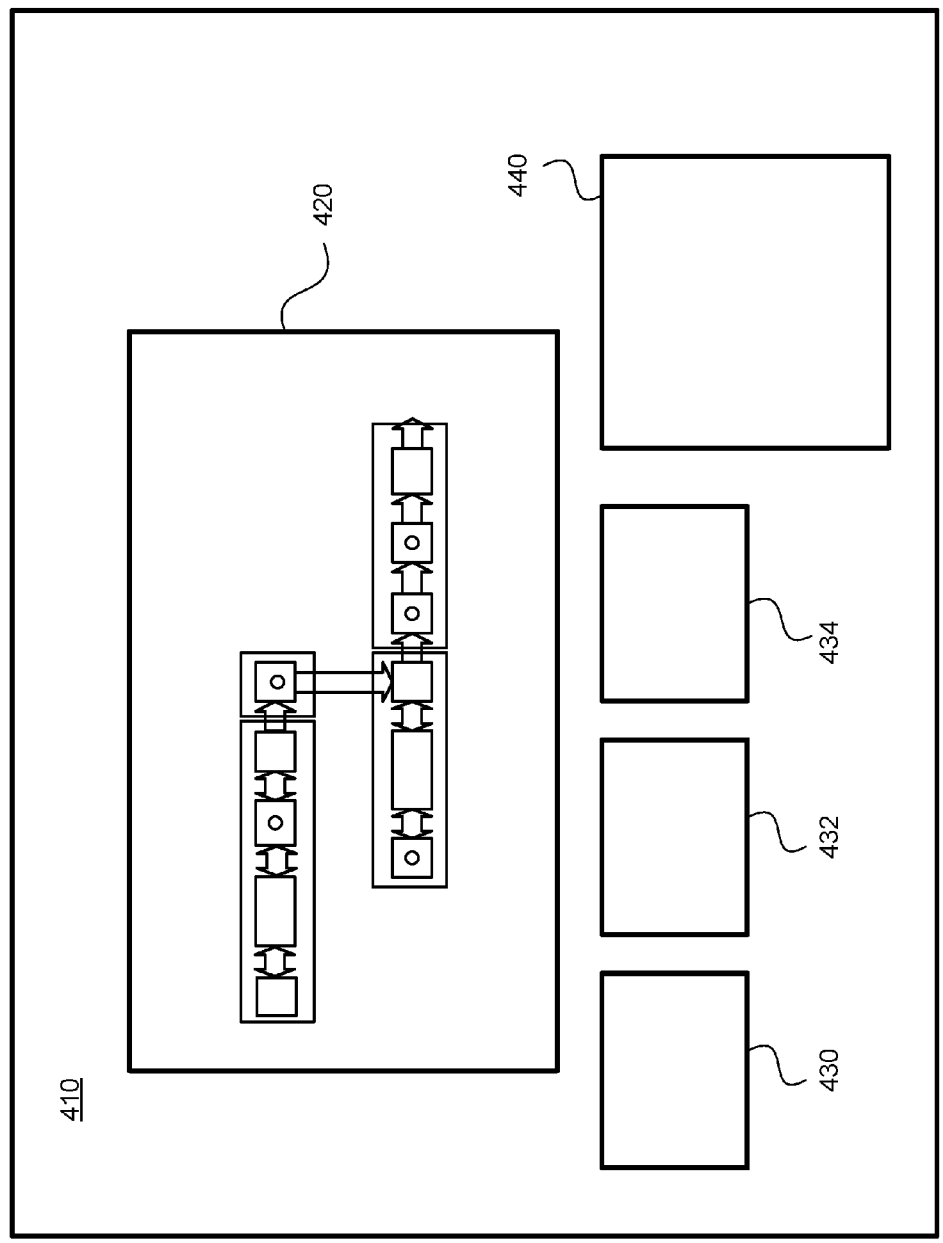
FIG. 7 is a graphical representation of an overall broad conception of a GUI for controlling a one or more actuators for electrically actuated through-the-wall adjusters according to an aspect of the disclosed subject matter.

As mentioned, the alignment system may be operated according to any one of several modes. In a manual mode, the user, such as a technician or a field service engineer, may use input device 410 in the form of a GUI as shown in FIG. 7 to directly modify the position and/or orientation of available optics. As shown, the GUI may include a graphical representation 420 of which electrically actuated TWA is being adjusted, with intensity profiles, such as an image of a fluorescent screen, or other beam properties in graphical representations 430, 432, and 434, and the 2D image 440 from the CASMM 250. While in the example shown there are three graphical representations it will be understood that fewer or more graphical representations could be provided.

The alignment system may also be operated in a semi-automatic mode in which the user may initiate combinations of actions with a single input. Such actions could range from including automatic sweeps of selected actuators to completing one of the tasks in the task sequence shown in FIG. 6.

It should be noted that for alignment, it may be preferred to use not only the near field image but also to use the far field image. The far field image may be used, for example, to determine whether the light beam is pointing in the proper direction.

Figure 8:
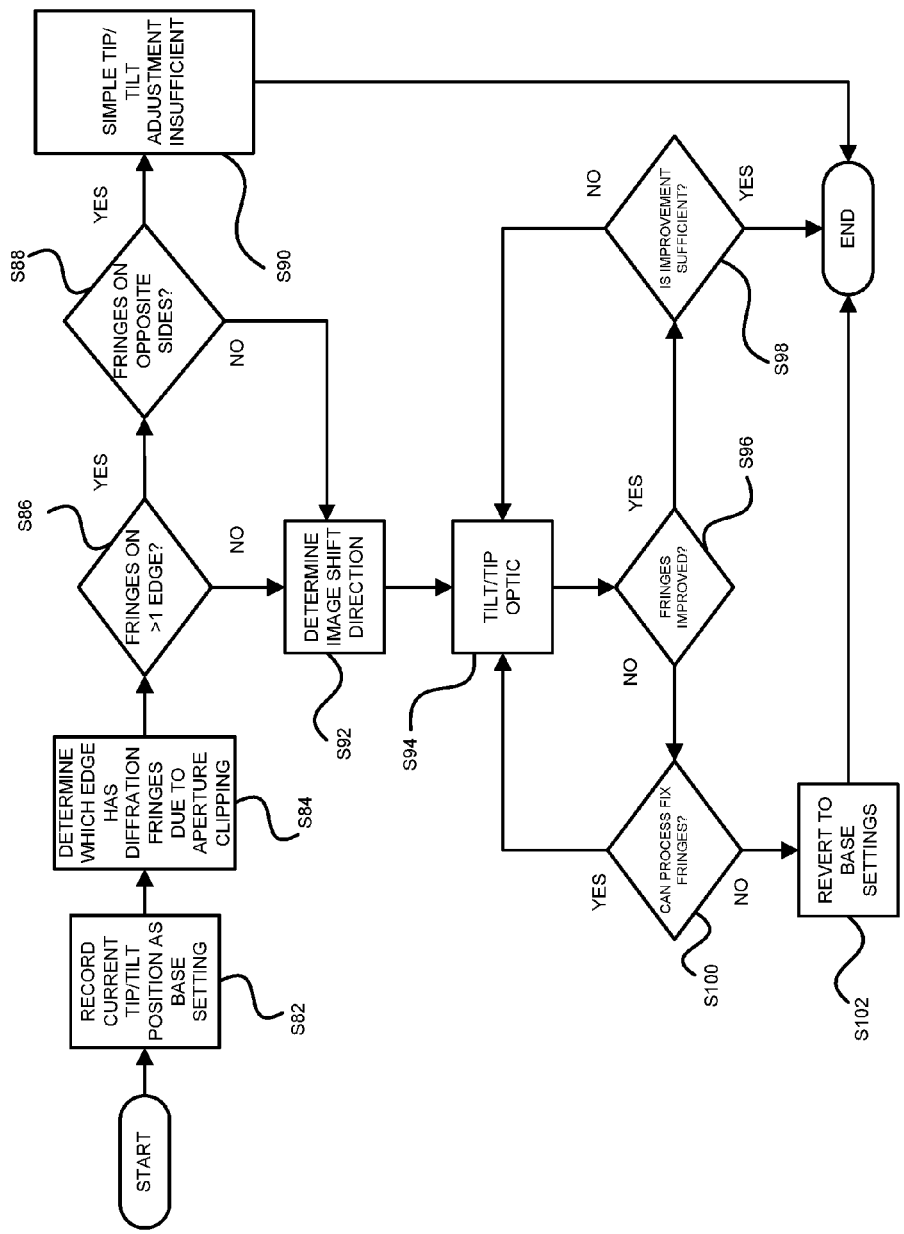
FIG. 8 is a flow chart depicting a method of correcting aperture clipping according to an aspect of the disclosed subject matter.

FIG. 8 is a flow diagram for a process for correcting for diffraction fringes from aperture clipping. Though shown in the figure and described below as applying to a single optic, it will be understood that this process can be applied systematically and sequentially to more than one optical element. In a step S82, a current state of an optical element such as a mirror with respect to its available degrees of freedom (e.g., tip/tilt/translation is recorded as a base setting. In a step S84, a determination is made as to which edge or edges in the near field image exhibit diffraction fringes due to aperture clipping. The near field image is rectangular, so all four sides are examined for the presence of diffraction fringes. In a step S86 a determination is made as to whether there are diffraction fringes on more than one edge of the near field image. If there are, then a determination is made in a step S88 as to whether the fringes are on opposite sides of the near field image (vertical or horizontal). If the determination in step S88 is affirmative, then it is assumed in a step S90 that a simple adjustment of the tip or tilt of the optical element will be insufficient to resolve the aperture clipping completely since the beam overfills the aperture. Small adjustments in the tip or tilt angle of the optical element may be done to balance the extent of diffraction fringes subject to the constraint that the energy centroid and pointing direction of the beam remain within specification, and the process is terminated. If, on the other hand, it is determined in step S88 that the diffraction fringes are not on opposite sides but are instead on adjacent edges, then the logic of the process moves to a step S92 with the knowledge that adjustments in two directions may be made. In step S92 the image shift direction is horizontal and vertical if the assessment of step S88 is that two adjacent edges exhibit diffraction fringes, and horizontal or vertical if the assessment of step S86 is that diffraction fringes are present on only one side. The logic of the process moves to a step S94 in which the optic is tipped and tilted, or only tipped or tilted in accordance with the image shift direction deduced in step S92. In a step S96 it is determined whether the action taken in step S94 improved the fringes, i.e., suppressed them, indicating at least partial alleviation of aperture clipping. If yes, and it is determined in a step S98 that the improvement is sufficient, then the process ends. If it is determined in step S98 that the improvement is not sufficient then the process flow returns to step S94. If it is determined in step S96 that the fringes did not improve, then in a step S100 a determination is made as to whether the process can be expected to work. If yes, then the process flow returns to step S94. If not then in a step S102 the tip/tilt/translation state of the optical element is returned to the base settings recorded in step S82 and the process ends. If the image shift direction determined in S92 indicates that adjustments in two directions are needed (due to the presence of fringes on adjacent edges determined in S88), then the actions described for S94, S96, S100, S102, and S98 are done for each adjustment direction.

As another example of possible operation in a light source directed mode, adjustment could be based on correcting damage, e.g. the formation of slip planes in an optic, which induces spatial bias in a beam parameter, such as beam centroid. As with the previous example, the near field image from the CASMM 250 would be analyzed. If there indications of the formation of slip planes, then one or more optical elements could be adjusted to re-center the beam.

Figure 9:
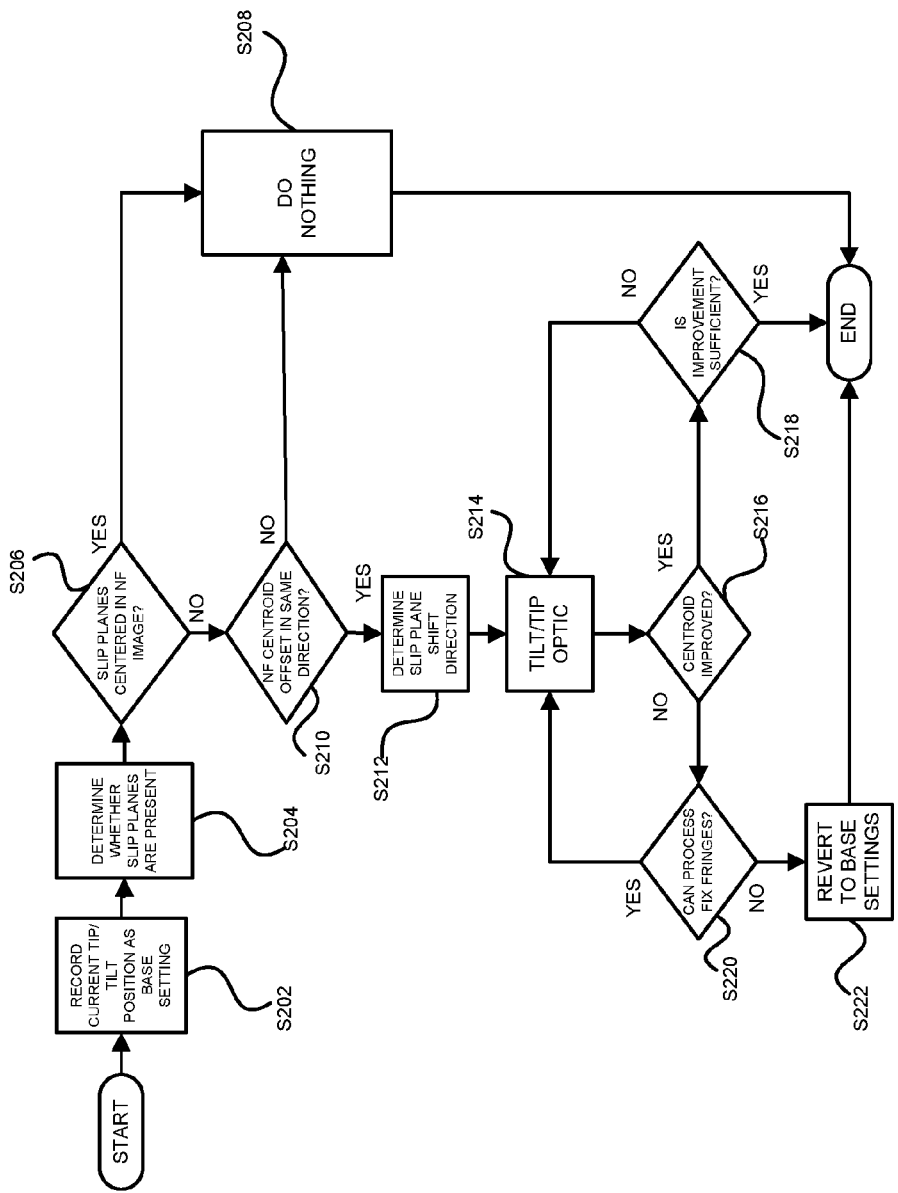
FIG. 9 is a flow chart depicting a method of correcting a centroid shift according to an aspect of the disclosed subject matter.

FIG. 9 is a flow diagram for a process for compensating for shift in the beam centroid due to slip planes. Though shown in the figure and described below as applying to a single optic, it will be understood that this process can be applied systematically and sequentially to more than one optical element. In a step S202, a current state of an optical element such as a mirror with respect to its available degrees of freedom (e.g., tip/tilt/translation) is recorded as a base setting. In a step S204, a determination is made as to whether slip planes are present. This can be accomplished using a process such as described in more detail below in connection with FIG. 12. In a step S206 a determination is made as to whether the slip planes are centered in the near field image or whether they are instead offset from the center of the near field image. If the slip planes are centered in the near field image then a determination is made in step S208 to take no action and the process is terminated. If the slip planes are not centered in the near field image then a determination is made in step S210 whether the centroid of the near field image is offset in the same direction as the slip plane offset. If the centroid of the near field image is not offset in the same direction as the slip plane offset then a determination is made in step S208 to take no action and the process is terminated. If the centroid of the near field image is offset in the same direction as the slip plane offset then a slip plane shift direction is determined in step S212. The logic of the process moves to a step S214 in which the optic is tipped and tilted, or only tipped or tilted in accordance with the slip plane shift direction deduced in step S212. In a step S216 it is determined whether the action taken in step S212 improved the position of the centroid. If yes, and it is determined in a step S218 that the improvement is sufficient, then the process ends. If it is determined in step S218 that the improvement is not sufficient then the process flow returns to step S214. If it is determined in step S216 that the centroid did not improve, then in a step S220 a determination is made as to whether the process can be expected to work. If yes, then the process flow returns to step S214. If not then in a step S222 the tip/tilt/translation state of the optical element is returned to the base settings recorded in step S202 and the process ends.

Note that although this process is described as correcting for a centroid shift due to slip planes its principles are not specific to correcting for a centroid shift due to slip planes and the process may also advantageously applied to correcting centroid shifts due to other factors, e.g. the onset of white fuzz on the beam footprint due, for example, to compaction under high UV fluence to the $CaF_2$ optics.

Figure 10:
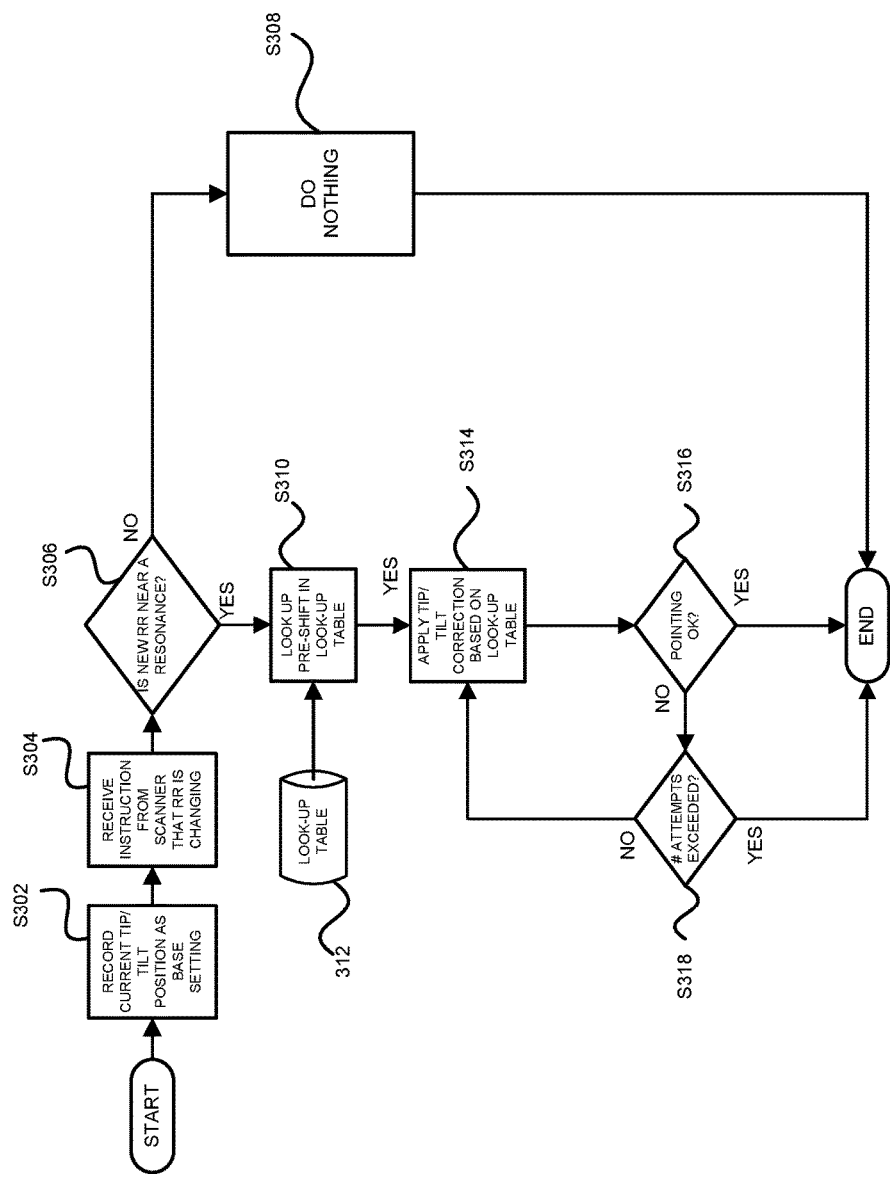
FIG. 10 is a flow chart depicting a method of correcting for a chamber resonance according to an aspect of the disclosed subject matter.

As another example of a possible operating mode, in a scanner directed mode the scanner could command the use of a particular repetition rate that falls near a chamber resonance frequency. In such circumstances the light source could respond by adjusting one or more optics to improve pointing by reducing the pointing total included range ("TIR"). FIG. 10 is a flow diagram of a process by which the light source may compensate for excessive pointing (i.e., the pointing TIR is larger than a specified value) if the scanner commands operation at a repetition rate that corresponds to a chamber resonance. The process involves tipping and/or tilting the PRA OC to compensate for excessive pointing. Either the resonance peak is lowered, or the floor is raised, or a combination of the two is effected so that the TIR is reduced. It is advantageous to use a lookup table to provide pre-determined tip/tilt adjustment values to minimize the time necessary to compensate for the effect of the resonance peak.

More specifically, as shown in FIG. 10, in a step S302, a current state of an optical element such as a mirror with respect to its available degrees of freedom (e.g., tip/tilt/translation) is recorded as a base setting. In a step S304, a determination is made whether the scanner has requested a new repetition rate ("RR" in the figure). In a step S306 a determination is made as to whether the new repetition rate is near a resonance frequency for the chamber. If the new repetition rate is not near a resonance frequency for the chamber then a determination is made in step S308 to take no action and the process is terminated. If the new repetition rate is near a resonance frequency for the chamber then in step S310 a pre-shift value is looked up in a look-up table 312. This pre-shift value is selected to provide optimum compensation for the resonance. More specifically, the pre-shift value is one that has been determined a priori, i.e. through rigorous system characterization and production calibration. One way to do this involves performing a careful optical alignment and recording the position of adjustable optics as base settings. This process is done off-line, but is otherwise the same as the first step in FIG. 10. Operating conditions such as rep rate and duty cycle are varied over a range of use cases, and their influence on performance parameters recorded. Adjustments to selected optics that improve performance parameters, especially in the neighborhood of a resonant frequency, are then made and the respective positions of the adjustable optics are recorded. This process is repeated over a range of operating conditions, which creates the look-up table.

The logic of the process moves to a step S314 in which the optic is tipped and tilted, or only tipped or tilted in accordance with the value for the pre-shift obtained in step S310. In a step S316 it is determined whether the action taken in step S314 improved the pointing sufficiently. If yes, then the process ends. If it is determined in step S316 that the improvement is not sufficient then the process goes to step S318 in which it is determined whether a maximum number of allowed attempts to improve pointing have been exceeded. If not, then the process reverts to step S314. If the maximum number of attempts has been exceeded, then the process ends. As modules and optical elements age, the tip/tilt settings stored in the look-up table 312 may no longer provide optimum compensation for the resonances, so a step S318 provides for optimizing compensation for the resonance effect. CASMM images may also be used to monitor divergence, and to detune the OPuS 240 to improve divergence performance.

It should be noted that prior to this invention any adjustment in pointing required taking the tool out of production, which meant lost revenue for the chip maker. One benefit of this invention is that a correction can be made during pauses in production, e.g. between wafer exposures. Also, depending on which auto-alignment mode is being used, a pointing correction can be made during a tool-down event, but take much less time than would be required using purely manual adjustment.

As described, in a system according to one aspect of the present disclosure there is provision for automatic parsing, extraction and processing of near field CASMM images. This provides the capability of monitoring for the onset of defects. The detection of very low-contrast features such as lines and circular objects in images requires techniques beyond basic image processing techniques. Laser beams are heavily distorted and the task of automatic detection of rings or lines is not straightforward. The complexity of the problem is mainly due to the fact that the low-contrast lines and rings reside on top of a heavily distorted beam profile. But by tracking the intensity of low level features in CASMM images it is possible to monitor the evolution of component failures, quantify image distortions related to slip planes, and estimate various levels of component failures. It is also possible to correlate quantified image distortions with CASMM log data and identify new signatures correlated with other deterioration mechanisms.

Figure 11:
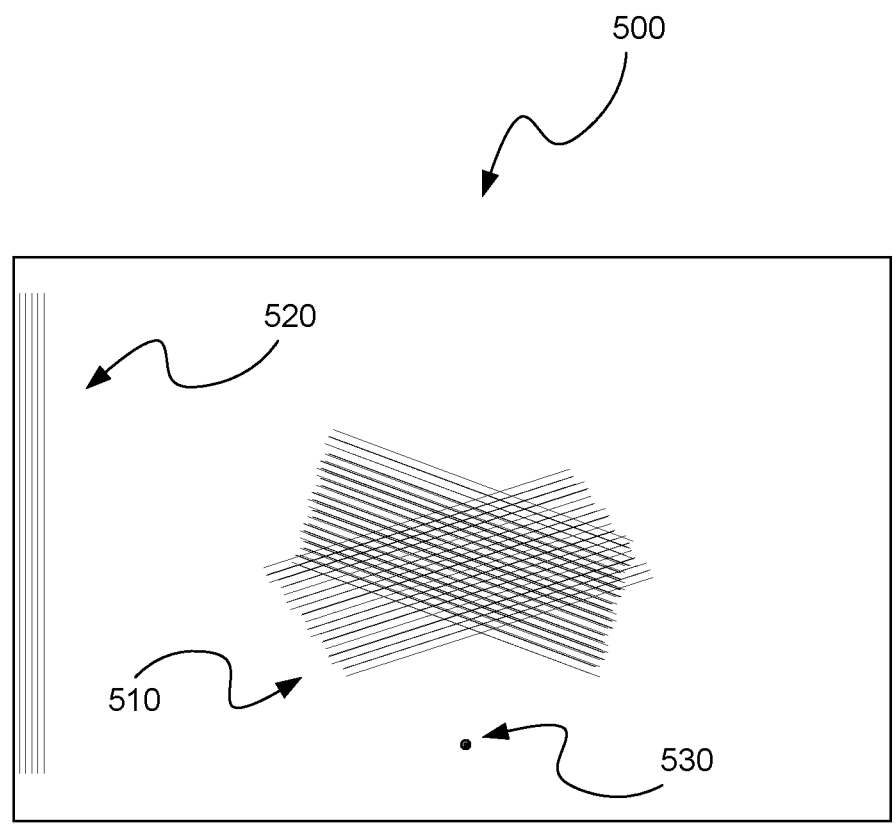
FIG. 11 is a graphical representation of features possibly present in a CASMM near field image.

Several of the above processes used to determine a condition in situ such as the presence of slip planes involve the use of a combined auto-shutter metrology module 250 or CASMM 250. The CASMM 250 attaches to the illumination source 105 at the light source exit port. Among its functions is the ability to acquire in a single image the near field and the far field. In the examples above the near field is used. By carefully inspecting near field images, it is possible perceive very faint, straight lines at selected angles, e.g. ±15° or ±30°. These are depicted graphically in the representation of a CASMM near field image 500 in FIG. 11 as feature 510. However, these lines are difficult to see and easy to overlook. Also in FIG. 11 the presence of aperture clipping can be expected to manifest itself as a series of vertical or horizontal lines at one or more of the edges of the CASMM near field image 500. This is represented in FIG. 11 as feature 520. Also in FIG. 11 the presence of a point-like defect can be expected to manifest itself as a circular image or "ring" in the CASMM near field image 500. This is represented in FIG. 11 as feature 530. As with slip planes, these features are difficult to see and easy to overlook, and at present there is no way to detect them automatically, nor is it currently possible to monitor the progression of the defects creating these features over time.

Figure 12:
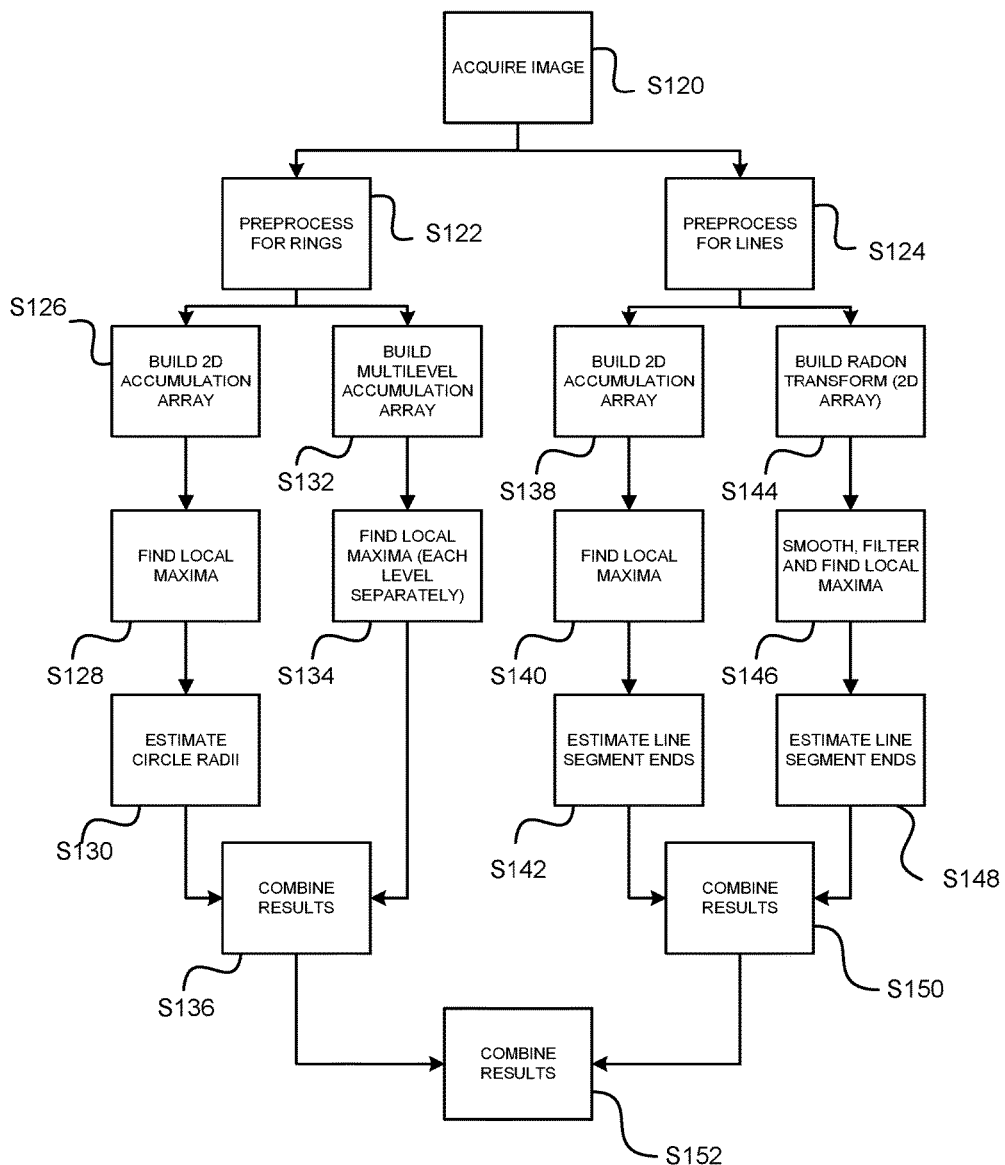
FIG. 12 is a flow chart depicting a method of extracting features possibly present in a CASMM near field image according to an aspect of the disclosed subject matter.

FIG. 12 shows a method enabling the detection of slip plane lines and rings separately. Referring to FIG. 12, processes on the left side of the flow chart are used for detecting interference rings while processes on the right side of the flow chart are used for detecting slip planes. Step S120 in the first block in FIG. 12 is image acquisition; which involves retrieving the image from the CASMM 250 and extracting the near field image. As mentioned, the near and far field 2D images are captured in a plane normal to the direction of beam propagation. A screen of fluorescent glass is used to create a visible image of the beam. An image sensor such as a 2D camera captures near field and far field 2D images of the beam. The near field image is then processed at a preprocessing step S122, for detecting interference rings. A similar preprocessing step S124 is performed for detecting slip planes. The preprocessing step S122 for detecting interference rings is essentially the same as the preprocessing step S124 for detecting slip planes except that the frequency responses may be different depending on the type of feature being detected. The image data first preferably passes through an unsharp filter. The unsharp filter is a simple sharpening operator which derives its name from the fact that it enhances edges (and other high frequency components in an image) via a procedure which subtracts an unsharp, or smoothed, version of an image from the original image. It is sometimes referred to as the negative of the Laplacian filter. The image data then passes through a band pass filter that eliminates undesirable frequencies. The frequency response of the band pass filter may be selected empirically to obtain the most distinct distortions in the output image. Thus, the frequency response which may be used to detect interference rings may be different from the frequency response used to detect linear features such a slip planes lines. The output of the bandpass filter has a histogram (pixel intensity values vs. frequency of pixel intensity values) that can be stretched to enhance the contrast in the image.

Preferably, the circular features in the near-field image are extracted using two techniques in which a Circle Hough Transform ("CHT") is used to extract the circular features and detect them. CHT is a specialization of the Hough Transform. The purpose of the technique is to find circles in imperfect image inputs. The Circular Hough Transform relies on generating an image (accumulation array) based on the input image, such that the value at each pixel corresponds to the likelihood that a distortion ring center exists at that specific pixel. The generated image is processed to find the reasonable locations of centers and estimate the corresponding radii. The process of building the accumulation array is sometimes referred to as voting. Thus, in FIG. 12, in a step S126 a 2D accumulation array (or accumulator matrix) is built. The accumulation array is thus basically an image with high values at pixels that are more likely to be the center of a distortion ring. The first step is to find the gradient field of the input image and use a threshold to find the pixels with gradient value above this threshold. At this point the accumulation array is initialized with zero values at every pixel. Then, for each vector in the gradient field, all the pixels in the same direction of this vector are determined and their values in the accumulation array are incremented. The range of pixels is determined by a fixed value related to the radius of the biggest ring radius expected. Pixels with high gradient value correspond to strong edges in the input image.

A different approach may be used for building the accumulation array. Instead of incrementing pixels in the range of each vector in the gradient field, a template may be used. The template would basically be an image containing vectors in a predefined and fixed way. To build the accumulation array, the center of the template is placed at a pixel (say X) in the gradient field. Then the dot product is obtained between all the vectors and pixels in the template and the corresponding vectors in the gradient field, the values are added, and the sums are stored as the value of the pixel X in the accumulation array. If a ring happened to be centered at pixel X with the same radius as the template, all the vectors will be exactly aligned and pixel X will have a very high value. A single template is preferably used for entire image. This approach gives the flexibility to create templates with different shapes or use real distortions from operating lasers.

In a step S128 the local maxima are found, and in step S130 the circle radii are estimated.

In another branch of the process, a multilevel accumulation array is built in step S132. In a step S134 local maxima are found for each level.

In a step 136 the results of the two CHT analyses are combined.

For detection of slip planes, again the process flow occurs in two branches. In one branch a Standard Hough Transform ("SHT") is performed by first building an accumulation array in a step S138. Then local maxima are identified in a step S140. Then line segment ends are estimated in a step S142. In another branch, a radon transform is performed by first building a 2D Radon Transform array in a step S144. The Radon transform is the projection of the image intensity along a radial line oriented at a specific angle. Each column in the transform represents a projection with a different angle. The results are then used to smooth, filter, and find local maxima in a step S146. This information is used to estimate line segment ends in a step S148. The results of the two branches are combined in a step S150. Then preferably the results of step S136 and S150 are combined in a step 152 to create a processed near field image. The processed near field image will include the features in an extracted form in which they are more clearly visible and which can be detected automatically more easily.

In cases where multiple low level features exist, the Radon transform (or the standard Hough transform) may not yield robust detection results. In such cases, an alternative approach may be to use a bank of matched filters to detect lines at specific angles. Each filter may be a finite impulse response ("FIR") filter to process the image.

One advantage of the above process is that images can be retrieved and processed at selected intervals over a period of time. Over time it can be expected that the feature 510 indicating the existence of slip planes will grow as slip plane formation becomes more extensive or pronounced. This information can be used to determine when a maintenance event should be scheduled.

To obtain a quantified measure of the extent of slip plane degradation a binary counter array may be initialized to a preset value (e.g., zero) prior to the onset of slip planes. Signals from new slip planes may be added to the counter array as they appear in subsequent images. The counter array may be integrated on an image-by-image basis to form a one-dimensional, time-dependent, quantized slip plane signal.

Since each image also correlates to a measurable number of incident light pulses, this quantized slip plane signal can also be considered as a function of pulse count. This alternative signal provides information that allows one to assess cumulative pulse-related degradation. It also allows comparison of optical degradation of low use and high use light sources.

The binary nature of the counter array ensures that the contribution from slip planes that have previously been detected, but are temporarily undetectable because they are not illuminated, are not misidentified as "new" slip planes when they reappear. An additional benefit of this process is that it reduces noise in the quantized slip plane signal, which facilitates the use of this signal in efforts to determine when the optic ought to be replaced.

The counter size can be equal to the image size in pixels. This process leads to a quantized slip plane signal that increases with time until the optic with the excessive slip planes is replaced. Also, by adjusting the detection angle of the slip plane detection method, some types of laser misalignment can be detected.

The processed near field images can thus successfully differentiate slip planes from point defects and from diffraction off an aperture. The method can also be used to detect vertical line damage.

Thus a method for automatically detecting slip plane defects that may be conceived of as including the following steps: (1) parsing the file containing the binary source image data and converting it to a form suitable for analysis; (2) detecting the location of the near field (this location varies slightly from image to image, and from CASMM to CASMM); (3) extracting from the CASMM image the portion corresponding to the near field; (4) enhancing the near field image to make features more conducive to automated analysis by sequentially applying an unsharp filter, a bandpass filter, and a contrast spreading function; (5) perform a Hough Transform by building an accumulation array with high values at locations that are more likely to be along the edges of lines, and finding local maxima and estimate ends of lines segments; (6) using a Radon Transform to first build a radon transform array and smoothing, filtering, and finding local minima; (7) combining the results of the Hough Transform (step 5) and the Radon Transform (step 6); and (8) communicate the combined results to a database (via diagnostic values and/or configurable values, data logs, etc.).

A method for automatically detecting point-like defects may be conceived of as including the following steps: (1) parsing the file containing the binary source image data and converting it to a form suitable for analysis; (2) detecting the location of the near field (this location varies slightly from image to image, and from CASMM to CASMM); (3) extracting from the CASMM image the portion corresponding to the near field; (4) enhancing the near field image to make features more conducive to automated analysis by sequentially applying an unsharp filter, a bandpass filter, and a contrast spreading function; (5) using a first modified, circular Hough transform (CHT) to build an accumulation array with high values at locations that are more likely to be along the rings, and finding local maxima within each level; (6) using a second modified, circular Hough transform to build a multi-level accumulation array, and smoothing, filtering, and finding local minima; (7) combining the results of the first modified circular Hough transform (step 5) and a second modified Hough transform (step 6); and building an accumulation array with high values at locations that are more likely to be the center of an interference ring; (8) finding local maxima and estimating circle radii; and (9) communicating the results to a database (via diagnostic values, and/or configurable values, data logs, etc.).

A method for automatically detecting slip planes and point-like defects may be conceived of as including the following steps: (1) parsing the file containing the binary source image data and converting it to a form suitable for analysis; (2) detecting the location of the near field (this location varies slightly from image to image, and from CASMM to CASMM); (3) extracting from the CASMM image the portion corresponding to the near field; (4) enhancing the near field image to make features more conducive to automated analysis; (5) building an accumulation array with high values at locations that are more likely to be the center of an interference ring, or a line; (6) finding local maxima and estimating circle radii and line lengths; (7) finding local maxima and estimate ends of lines segments; and (8) communicating the results to database (via diagnostic values and/or configurable values, data logs, etc.).

A method for retrieving and processing CASMM images for each laser light source having a CASMM may be conceived of as including the following steps: (1) identifying an identifier (e.g., a serial number (SN)) unique to the light source; (2) identifying an acquisition date for the light source; (3) retrieving the CASMM image file corresponding to the acquisition date from a memory source, e.g. from a file on a server; (4) parsing the file and extracting the near field image data; (5) processing the near field image data and detecting distortions (e.g., lines and circles); (6) summarizing the distortion information; (7) reporting the distortion information; and (8) repeating Steps 1-7 for each light source having a CASMM.

A method for retrieving and processing a sequence of CASMM images for a light source having a CASMM may be conceived of as including the following steps: (1) identifying a value (e.g., a serial number) unique to the specific light source; (2) identifying a first acquisition date for the light source; (3) identifying a final acquisition date for the light source; (4) retrieving a selection of CASMM image files from a memory source, e.g. from a file on a server, for a range of dates between and including the first acquisition date and the final acquisition date, and where each image has a timestamp; (5) for each image file taken in chronological order, parsing the file and extracting the near field image data; (6) processing the near field image data and detecting distortions (e.g., lines and circles); (7) integrating the distortion signal from the lines to form a quantified slip plane signal spanning the time of the first acquisition date to the timestamp of each image; (8) reporting the distortion information; and (9) repeating steps 1-8 for each light source having a CASMM. There may be a step after step (7) of extrapolating the distortion information to estimate a time to next failure ("fail-over time").

A method for retrieving and processing a sequence of CASMM images for a light source having a CASMM may be conceived of as including the following steps: (1) identifying a value unique to specific light source; (2) identifying a first acquisition date; (3) identifying a final acquisition date; (4) retrieving a selection of CASMM image files from a memory source, e.g. from a file on a server, for a range of dates between and including the first acquisition date and the final acquisition date, and where each image has a timestamp; (5) for each image file taken in chronological order, parsing the file and extracting the near field image data; (6) processing the near field image data and detecting distortions (e.g., lines and circles); (7) forming a quantified slip plane signal spanning the time of the first acquisition date to the timestamp of each image by compiling the maximal individual line distortions for each near field image; (8) reporting the distortion information; and (9) repeating steps 1-8 for each light source having a CASMM.

A method of creating a quantized slip plane signal may also be conceived of as including the following steps: (1) generating a sequence of fully processed CASMM images that have been processed to reveal lines oriented in a manner consistent with the orientation of slip planes (in binary form, i.e. where each pixel is either a 0 or a 1); (2) initializing a binary counter array to zero prior to the onset of slip planes; (3) adding to the binary counter array the signals from new slip planes as they appear; (4) integrating the counter array on an image-by-image basis to form a one-dimensional, time-dependent, quantized slip plane signal; (5) resetting the binary counter if substantially all of the slip plane indicators in the fully processed CASMM images vanish (and the light source remains in use).

A method of creating a quantized slip plane signal may also be conceived of as including the following steps: (1) generating a sequence of fully processed CASMM images that have been processed to reveal lines oriented in a manner consistent with the orientation of line damage (in binary form, i.e. where each pixel is either a 0 or a 1); (2) initializing a binary counter array to zero prior to the onset of slip planes; (3) adding to the binary counter array the signals from new slip planes as they appear; (4) integrating the counter array on an image-by-image basis to form a one-dimensional, time-dependent, quantized slip plane signal; and (5) resetting the binary counter if substantially all of the slip plane indicators in the fully processed CASMM images vanish (and the light source remains in use).

The above description includes examples of multiple embodiments. It is, of course, not possible to describe every conceivable combination of components or methodologies for purposes of describing the aforementioned embodiments, but one of ordinary skill in the art may recognize that many further combinations and permutations of various embodiments are possible. Accordingly, the described embodiments are intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is construed when employed as a transitional word in a claim. Furthermore, although elements of the described aspects and/or embodiments may be described or claimed in the singular, the plural is contemplated unless limitation to the singular is explicitly stated. Additionally, all or a portion of any aspect and/or embodiment may be utilized with all or a portion of any other aspect and/or embodiment, unless stated otherwise.

The invention claimed is:

1. A photolithographic apparatus comprising:
   a light source having at least one optical element located within a housing;
   an actuator that extends through a wall of the housing, is mechanically coupled to the at least one optical element, and is adapted to incrementally adjust the at least one optical element in response to a signal, a component of the actuator for imparting motion to the actuator in response to the signal being located outside of the housing;
   a module arranged to obtain a near field image of a light beam from the light source;
   a module arranged to extract information from the near field image; and
   a control system for generating the signal at least partially in response to the information extracted from the near field image.

2. A photolithographic apparatus as claimed in claim 1 wherein the control system generates the signal at least partially in response to a command input by a user.

3. A photolithographic apparatus as claimed in claim 1 wherein the module is additionally arranged to obtain a far field image of a light beam from the light source and further comprising a module arranged to extract information from the far field image, wherein the control system generates the signal at least partially in response to the information extracted from at least one of the near field image and the far field image.

4. A photolithographic apparatus as claimed in claim 1 wherein the module is arranged to extract information from the image performs extraction of information indicative of a state of alignment of the optical element.

5. A photolithographic apparatus as claimed in claim 4 wherein the control system generates the control signal on the basis of the information indicative of a state of alignment of the optical element and the actuator mechanically coupled to the optical element moves the optical element in response to the control signal.

6. A photolithographic apparatus comprising:
   a light source having at least one optical element;
   a module arranged to obtain a near field image and a far field image of a light beam from the light source;
   a module arranged to extract near field information indicative of a state of alignment of the optical element from the near field image;
   a module arranged to extract far field information indicative of a state of alignment of the optical element from the far field image;
   a control system for generating a control signal based at least in part on the at least one of the near field information and the far field information; and
   an actuator mechanically coupled to the at least one optical element and responsively connected to the control system and adapted to incrementally adjust an alignment of the at least one optical element in response to the control signal.

7. An optical element module for use in a photolithographic apparatus, the optical element module comprising:
   a housing;
   an optical element positioned within the housing; and
   an actuator that extends through a wall of the housing, is mechanically coupled to the optical element, and is adapted to incrementally adjust the at least one optical element in response to a signal, a component of the actuator for imparting motion to the actuator in response to the signal being located outside of the housing;

a module arranged to obtain a near field image of a light beam from a light source;

a module arranged to extract information from the near field image; and a control system for generating the signal at least partially in response to the information extracted from the near field image.

8. An optical element as claimed in claim 7 wherein the actuator comprises:

a threaded shaft coupled to the optical element; and the component of the actuator for imparting motion to the actuator comprises a motor coupled to the threaded shaft and arranged to rotate the threaded shaft.

9. An optical element as claimed in claim 8 wherein the motor comprises a stepper motor.

10. A photolithographic apparatus comprising:

a light source having at least one optical element;

a module arranged to obtain a near field image of a light beam from the light source;

a module arranged to extract image information from the near field image;

a control system arranged to receive the image information and for generating a signal at least partially in response to the image information; and an actuator mechanically coupled to the at least one optical element, arranged to receive the signal, and adapted to incrementally adjust the at least optical element in response to the signal.

11. A method for adjusting an optical element in a light source in a photolithography system comprising the steps of:

generating a light beam using the light source;

obtaining a near field image representative of the light beam;

extracting near field information from the image;

generating a control signal in response to the near field information from the near field image; and applying the control signal to an actuator mechanically coupled to an optical element in the light source to incrementally adjust the optical element in response to the control signal.

12. A method as claimed in claim 11 further comprising the steps of obtaining a far field image representative of the light beam; and extracting far field information from the far field image, and wherein the step of generating a control signal comprises generating the control signal in response to at least one of near field information and the far field information.

13. A method as claimed in claim 11 wherein the information indicates a state of alignment of the optical element.

14. A method for automatically detecting and adjusting an alignment of a light source for semiconductor photolithography, the method comprising the steps of:

obtaining an image of a light beam produced by the light source;

extracting a near field portion from the image;

obtaining image data from the near field portion;

performing a transform operation on the image data;

storing the results of the transform operation in a database; and incrementally adjusting at least one optical element in the light source based at least in part on the results of the transform operation.

15. A method for automatically detecting a state of a light source for semiconductor photolithography, the method comprising the steps of:

(a) obtaining an image of a light beam produced by the light source;

(b) extracting a near field portion from the image;

(c) obtaining image data from the near field portion;

(e) performing a transform operation on the image data;

(f) storing the results of the transform operation in a database, wherein steps (a) through (f) are performed repeatedly over a period of time to detect the state repeatedly and store a plurality of results of the transform operation in the database; comparing the plurality of stored results of the transform operation to determine an evolution of the state over time; and performing maintenance on the light source after a period of time having a duration based at least in part on the evolution of the state over time.

16. A method as claimed in claim 15 wherein the transform operation is at least one of a Circle Hough Transform, a Standard Hough Transform, and a Radon Transform.

17. A method as claimed in claim 15 wherein the state is an extent of existence of slip plane defects in at least one optical element in the light source.

18. A photolithographic apparatus comprising:

a light source having at least one optical element located within a housing;

an actuator that extends through a wall of the housing, is mechanically coupled to the at least one optical element, and is adapted to incrementally adjust the at least one optical element in response to a signal, a component of the actuator for imparting motion to the actuator in response to the signal being located outside of the housing;

a combined autoshutter metrology module arranged to obtain an image of a light beam from the light source;

a module arranged to extract information from the image; and a control system for generating the signal at least partially in response to the information extracted from the image.

19. A photolithographic apparatus comprising:

a light source having at least one optical element located within a housing;

an actuator that extends through a wall of the housing, is mechanically coupled to the at least one optical element, and is adapted to incrementally adjust the at least one optical element in response to a signal, a component of the actuator for imparting motion to the actuator in response to the signal being located outside of the housing;

a module arranged to obtain an image of a light beam from the light source;

a module arranged to extract feature information from the image using at least one of a Circle Hough Transform, a Standard Hough Transform, and a Radon Transform; and a control system for generating the signal at least partially in response to the information extracted from the image.

* * * * *